United States Patent
Kobayashi et al.

(10) Patent No.: US 8,048,259 B2
(45) Date of Patent: Nov. 1, 2011

(54) VACUUM PROCESSING APPARATUS

(75) Inventors: Michiaki Kobayashi, Kudamatsu (JP);
Tsutomu Nakamura, Hikari (JP);
Takeo Uchino, Kudamatsu (JP);
Akitaka Makino, Hikari (JP); Masashi Nakagome, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1150 days.

(21) Appl. No.: 11/512,309

(22) Filed: Aug. 30, 2006

(65) Prior Publication Data
US 2007/0068626 A1   Mar. 29, 2007

(30) Foreign Application Priority Data
Sep. 29, 2005 (JP) ................. 2005-283233

(51) Int. Cl.
C23F 1/00 (2006.01)
C23C 16/00 (2006.01)
C23C 14/00 (2006.01)
(52) U.S. Cl. .............. 156/345.31; 156/345.32; 118/719; 204/298.25; 204/298.35
(58) Field of Classification Search ................... 118/719; 156/345.31, 345.32
See application file for complete search history.

(56) References Cited

U.S. PATENT DOCUMENTS
2004/0069223 A1 * 4/2004 Tzeng et al. .................. 118/715
2004/0083970 A1 * 5/2004 Imafuku et al. ............... 118/719

FOREIGN PATENT DOCUMENTS
| JP | 8-172080 | 7/1996 |
| JP | 2001-77088 | 3/2001 |
| JP | 2002-520811 | 7/2002 |
| WO | WO 00/02228 | 1/2000 |

* cited by examiner

Primary Examiner — Karla Moore
(74) Attorney, Agent, or Firm — Antonelli, Terry, Stout & Kraus, LLP.

(57) ABSTRACT

A plasma processing apparatus which contributes to reducing required time for maintenance and thereby to enhancing the efficiency of processing and that of apparatus operation is to be provided. A vacuum processing apparatus comprises a vacuum vessel in which a substrate-shaped sample is arranged in an internally arranged processing chamber in which the pressure is reduced; a transfer chamber to which the vacuum vessel is linked and through whose inside reduced in pressure the sample is transferred; a passage which establishes communication between the transfer chamber and the vacuum vessel in a state in which the transfer chamber and the processing chamber are linked to each other and through whose inside the sample not yet processed or already processed is transferred; and a covering member which is removably coupled to cover the internal wall face of the passage, wherein the sample is processed within the processing chamber with a plasma formed in the processing chamber.

12 Claims, 5 Drawing Sheets

VACUUM PROCESSING APPARATUS

CLAIM OF PRIORITY

The present application claims priority from Japanese application serial JP 2005-283233 filed on Sep. 29, 2005, the content of which is hereby incorporated by reference into this application.

BACKGROUND OF THE INVENTION

The present invention relates to a vacuum processing apparatus for processing with plasma a sample in a processing chamber within a vacuum vessel, and more particularly to a vacuum processing apparatus provided with a transfer chamber within whose evacuated inside a sample is transferred and a processing chamber to communicate with each other to form a passage within which the sample is to pass.

For an apparatus such as the one referred to above, especially for a processing apparatus which is provided inside with at least one vessel having a processing chamber for processing with a plasma a sample to be processed, such as a semiconductor wafer or substrate, in an evacuated processing chamber, improvement of the efficiency of processing the substrate to be processed has been called for as the processing has become finer and more precise. To meet this requirement, in recent years so-called multi-chamber type apparatuses, each having plural processing chambers connected to it, have been developed to enable one sample to go through plural steps in a single apparatus or plural samples to be processed in parallel and thereby to enhance the efficiency of processing.

In such apparatus which is provided with plural processing chambers or processing vessels and performs processing, each of the processing chambers is connected to a transfer chamber whose internal gas and pressure can be controlled to be reduced and which is equipped with a robot arm or the like for transferring the substrate.

In this configuration, the substrate either not yet processed or already processed is carried from one processing chamber to another within the transfer chamber whose inside is reduced in pressure or loaded with inert gas, and the processing is continuously carried on without allowing the substrate to come into contact with the external atmosphere. Therefore, the contamination of the substrate is restrained, and the yield and efficiency of the processing are enhanced. Also, the time for raising or reducing the pressure within the processing chamber and the transfer chamber can be fully or partly saved, resulting in a shortened processing sequence and enhanced processing efficiency, with the overall labor and time taken to process the substrate reduced.

Such apparatus, in which each processing vessel is detachable from the apparatus itself or the transfer chamber, can be adapted to a new processing process by replacing, or altering the combination of, its processing vessels without replacing the apparatus as such, and this feature contributes to keeping low the cost of manufacturing the product by processing its substrate.

Between the processing chamber and the transfer chamber in each processing vessel of such an apparatus, a passage to establish communication between them is arranged so that samples can be transferred between the two chambers. Usually, such a passage is arranged on a side wall of a processing vessel or a transfer vessel having a transfer chamber within, and a sample held by a robot arm, which is the means of transferring, is exchanged between the processing chamber and the transfer chamber past the inside of the passage penetrating adjacently arranged the side walls.

Known techniques regarding a plasma processing apparatus equipped with such a detachable processing vessel include what is disclosed in Japanese Translation of Unexamined PCT Application No. 2002-520811. According to this known art, a chamber in which semiconductor wafers are processed is linked to cluster tools, and a substrate is transferred into and out of the substrate processing position arranged in the chamber through a slit passage within the chamber body. This slit passage is opened and closed with at least one valve door.

As the above-described conventional technique involves a lack of consideration in the following respect, it is beset with a problem.

Namely, while a substrate, which is the sample to be processed, is processed with a plasma formed by the application of an electric field or a magnetic field to processing gas supplied into the processing chamber, the excited processing gas, processing products or unused processing gas remain around the sample even after the end of the processing, and these gases and products move together with the sample when the sample is transferred outside.

Some of these gases and products stick to the surrounding wall faces of the apparatus during the transfer, and they are particularly apt to stick to the internal walls of the passage between the processing chamber and the transfer chamber, which is often formed in a size close to those of the sample and the robot arm, which is the means of transferring, on account of the limitation of apparatus size.

As a result, mutual actions between reactions with the highly reactive gases and the sticking of the products occur on the wall faces of this passage to invite the progress of contamination and degeneration of the wall faces, which have to be cleaned when the progress has reached an intolerable extent.

Since such a passage is constrained in size as mentioned above, it takes much labor and time to clean and otherwise maintain it. This eventually sacrifices the operable period of the apparatus, inviting detrimental effects to the efficiency of its operation and that of processing, but the above-described known art ignores this aspect.

Furthermore, this problem results in forcing the maintenance worker to do the job in an improper body position for a long time. Another trouble is that, while the products are removed by wet wiping-off, some of the contaminants tend to escape the wiping-off, which involves accidental damaging of the internal wall faces of the passage and deterioration in maintenance accuracy. These problems have not been taken into consideration either.

SUMMARY OF THE INVENTION

An object of the present invention, therefore, is to provide a plasma processing apparatus which contributes to reducing the time required for maintenance and thereby to enhancing the efficiency of processing and that of apparatus operation.

The object stated above is achieved by a vacuum processing apparatus comprising a vacuum vessel in which a substrate-shaped sample is arranged in an internally arranged processing chamber in which the pressure is reduced; a transfer chamber to which this vacuum vessel is linked and through whose inside reduced in pressure the sample is transferred; a passage which establishes communication between this transfer chamber and the vacuum vessel in a state in which the transfer chamber and the processing chamber are linked to each other and through whose inside the sample not yet processed or already processed is transferred; and a covering member which is removeably coupled to cover the internal wall face of the passage and provided with a pair of plate spring members which, in the coupled state, cover the mutually opposite internal wall faces in the lengthwise direction of the passage along the wall faces, wherein the sample is processed within the processing chamber with a plasma formed in this processing chamber.

Products resulting from the processing stick to the covering member.

Further, the object can be achieved by having the covering member permit the parts which come into contact with the internal wall faces of corners of the passage at both ends of the plate spring members to be displaced in the vertical direction or the lateral direction of this passage.

The object can also be achieved by making the plate spring members removable from the covering member.

The object can further be achieved by a configuration in which the covering member has connecting members linked to plate spring members at both ends of each of the plate spring members, and each of these connecting members has a wedge-shaped guide whose width in the vertical direction becomes smaller toward the transfer chamber or the processing chamber and two pieces arranged above and underneath this guide, and these pieces separate from each other in the vertical direction along with the movement of the guide toward the transfer chamber or the processing chamber.

The object can also be achieved by a configuration in which the connecting members are linked to the plate spring members of each with prescribed backlashes and can be displaced with respect to the plate spring members in the widthwise direction of the passage.

Further, the object can be achieved by a configuration in which the connecting members can be disassembled into plural parts including the plate spring members, the guides and the pieces.

The object can also be achieved by a configuration in which the connecting members can be assembled of plural parts including the plate spring members, the guides and the pieces.

Further, the object can be achieved by a configuration in which the connecting members can be disassembled into plural parts including the plate spring members, the guides and the pieces or can be assembled of these parts.

DETAILED DESCRIPTION OF THE PREFERRED EMBODIMENT

A preferred embodiment of the present invention will be described in detail below with reference to the accompanying drawings.

Figure 1:
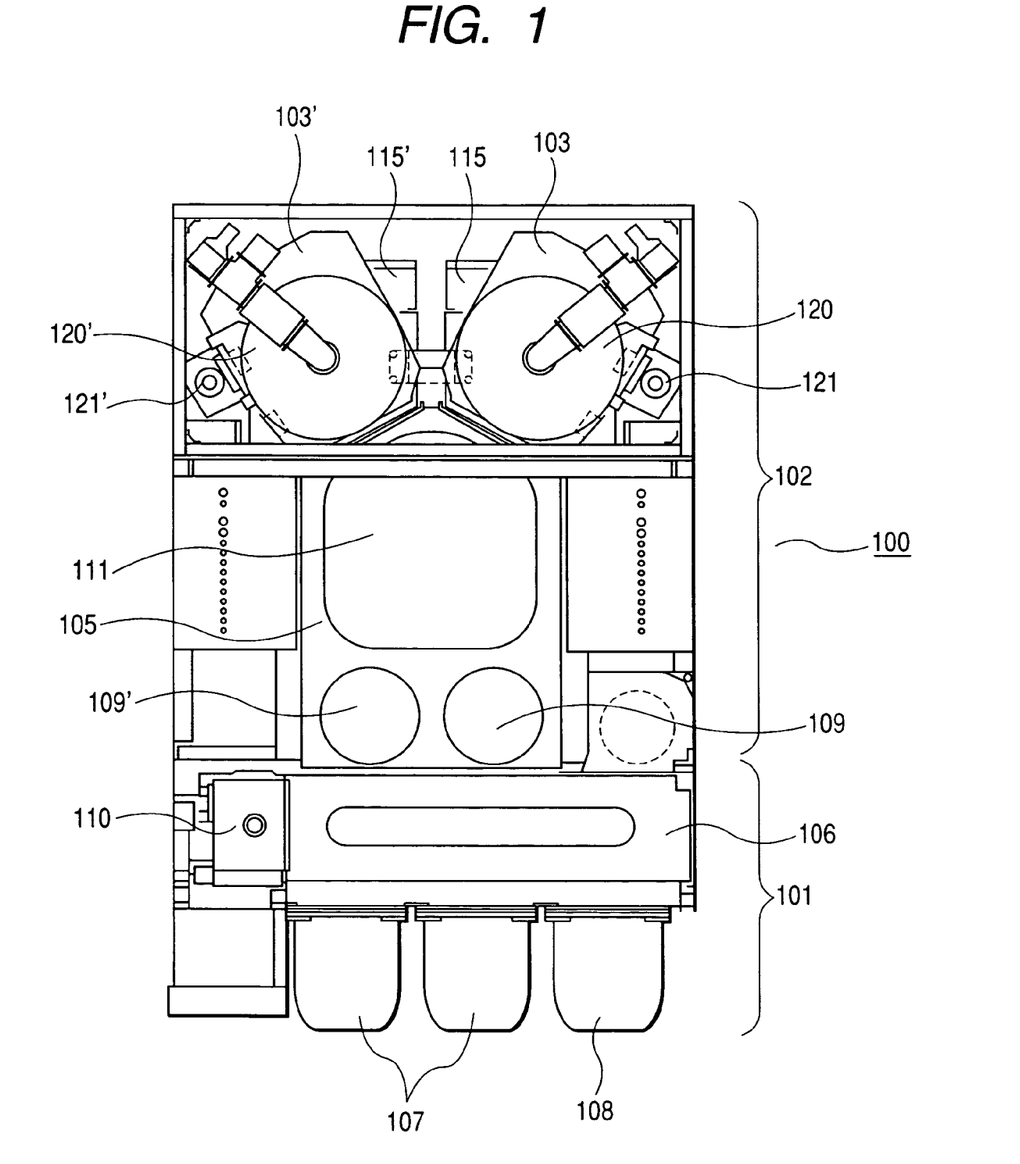
FIG. 1 shows a general top view of the configuration of a vacuum processing apparatus, which is a preferred embodiment of the present invention.
Figure 2:
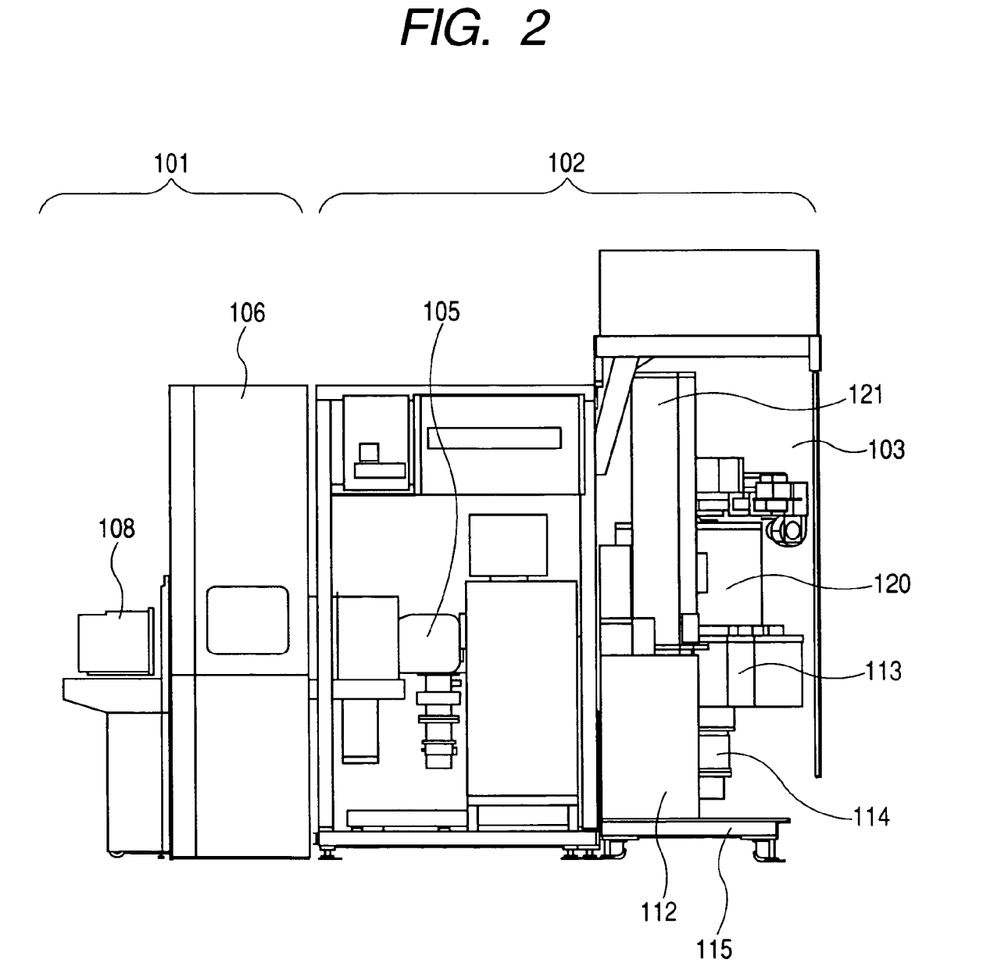
FIG. 2 shows a general side view of the configuration of the vacuum processing apparatus, which is the preferred embodiment of the invention.

FIG. 1 and FIG. 2 show the general configuration of the vacuum processing apparatus, which is the preferred embodiment of the invention. FIG. 1 is a plain view from above and FIG. 2 is a side view.

In these drawings, a vacuum processing apparatus 100 embodying the invention is broadly divided into two blocks, front and rear. The front part positioned in the lower portion of the vacuum processing apparatus 100 in the drawing, which constitutes the body of the apparatus, is an atmospheric side block 101 in which a wafer supplied to the apparatus is transferred to a chamber whose inner pressure is reduced under the atmospheric pressure and supplied to the processing chamber. The rear part positioned in the upper portion of the vacuum processing apparatus 100 is a processing block 102.

The atmospheric side block 101 has a box-shaped case 106 provided inside with a transferring robot (not shown), and plural wafer cassettes 107 in which wafers for processing or cleaning use are accommodated and a dummy cassette 108 for dummy wafers are detachably coupled side by side toward the front face of this case 106. Further, the transferring robot arranged within the case 106 transfers wafers in or out between these cassettes 107 and 108 and lock chambers 109 and 109'. The atmospheric side block 101 is also provided with an aligning unit 110 on a side face of its case 106, and the wafer transferred within this aligning unit 110 is aligned to the posture of wafer arrangement in the cassette 107 or 108 or the lock chamber 109 or 109'.

The processing block 102 comprises processing units 103 and 103', in which processing chambers which provide spaces for the wafer to be processed are arranged within the vacuum vessel whose inside is reduced in pressure, a transferring unit 105 which transfers the wafer to these processing chambers under reduced pressure and whose planar shape as viewed from above is a substantial polygon (a substantial pentagon in this embodiment) and plural lock chambers 109 and 109' to connect this transferring unit 105 and the atmospheric side block 101. These are units which are reduced in pressure within to maintain a high level of vacuum, and the processing block is a vacuum block.

The processing units 103 and 103' of the processing block 102 in this embodiment are so arranged along two adjoining sides of the substantial pentagon of the transferring unit 105. In this embodiment, these processing units 103 and 103' constitute etching units provided with processing chambers in which the wafer transferred from the cassettes 107 to the processing block 102 are etched, and the transferring unit 105 comprises a vacuum transfer chamber 111 to which these processing units are detachably coupled and whose inside is reduced in pressure to a high level of vacuum, which is maintained as the wafer is transferred through it.

Each of the plural lock chambers 109 and 109', to which a vacuum exhaust device (not shown) is connected, has a space so configured as to be able to keep the inside pressure at a high level of vacuum or at the atmospheric level in a state of being mounted within the semiconductor wafer to be processed. Gate valves (not shown), arranged before and behind these chambers in the drawing, open and close air-tightly the inner spaces of the atmospheric side block 101 or the case 106 and the vacuum transfer chamber 111 between each other to enable them to mutually communicate. In this embodiment, the lock chambers 109 and 109' have similar functions to each other and neither is limited to the function from the vacuum to the atmospheric pressure or vice versa, but each can be limited to one or the other purpose if the required specification calls for such specialization.

In this processing block 102, the processing units 103 and 103' respectively have vacuum vessels 113 and 113' (not shown) each provided with a processing chamber whose inside pressure can be reduced and which is to perform etching. These vacuum vessels 113 and 113' respectively have vacuum exhaust devices 114 and 114' (not shown) for reducing pressure, arranged underneath the vessels. Further, frame bases 115 and 115', which support from above the vacuum vessels 113 and 113' and the devices 114 and 114' linked to them, and plural supporting pillars which are arranged over these frame bases 115 and 115' and link the frame bases and the vacuum vessels 113 and 113' to support the vacuum vessels 113 and 113' enable the processing units 103 and 103' to be fixed to and held on the floor surface where the vacuum processing apparatus 100 is installed.

Between the vacuum vessels 113 and 113' and the frame bases 115 and 115', there are spaces, in which box-shaped frames 112 and 112' to accommodate exhaust units needed for processing in the units or processing chambers and utilities including sources of power supply are arranged, and the vacuum exhaust devices 114 and 114' are also disposed. Thus these spaces require maintenance.

Above these vacuum vessels 113 and 113', there are arranged coil cases 120 and 120' accommodating electromagnetic coils which provide magnetic fields for forming plasmas in the processing chambers arranged inside them. Between the frames 112 and the vacuum vessels 113, there are provided lifting devices 121 and 121', such as lifter cranes, which are coupled to the vacuum vessels 113 and 113' to vertically move the coil cases 120 and 120'. These lifting devices 121 and 121' enable the user to open the insides of the vacuum vessels 113 and 113' to perform maintenance and inspection with greater ease.

In this embodiment, the lifting devices 121 and 121' are provided on the processing units 103 and 103', each coupled to one or another side of the substantial polygon, which is the planar shape of the vacuum transfer chamber 111, and on the sides of the vacuum vessels 113 and 113'. Each of these sides is coupled to the reverse side of the vacuum vessel to the side of the vacuum vessel it adjoins. In the space underneath the lifting devices 121 and 121' and between the frame bases 115 and 115', there are arranged the frames 112 and 112' to effectively utilize the limited space around the processing units 103 and 103'.

Figure 3:
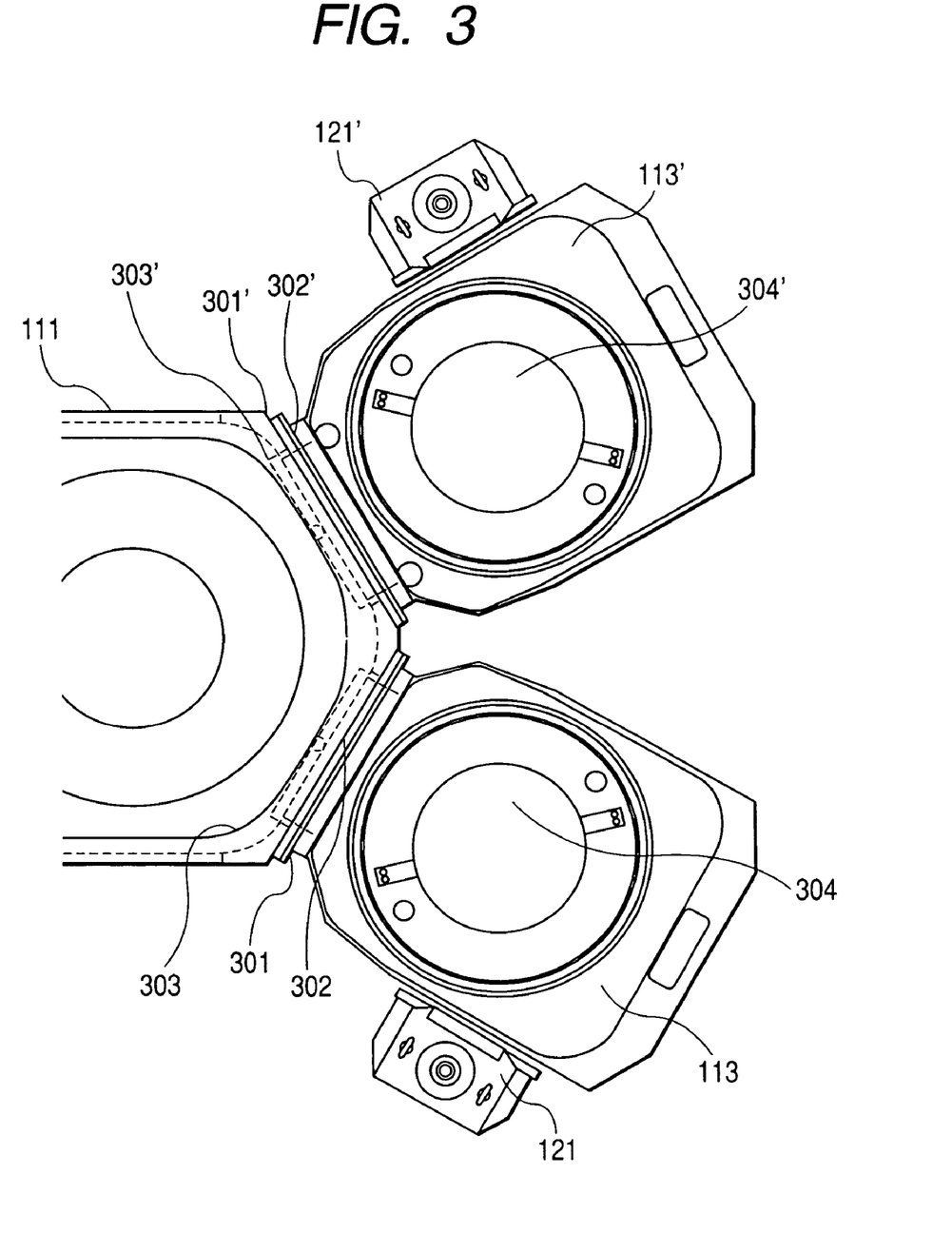
FIG. 3 shows an enlarged top view of the linking parts between the transfer chamber and the vacuum vessels of the vacuum processing apparatus shown in FIG. 1.

Now, the gate part provided with an inner cover in the vacuum processing apparatus according to the invention will be described with reference to FIG. 3. FIG. 3 shows an enlarged top view of the linking parts between the transfer chamber and the vacuum vessels of the vacuum processing apparatus shown in FIG. 1. In this drawing, neither the structure for the formation of an electric field and a magnetic field arranged above the vacuum vessels of the processing units nor the robot arm for sample transferring arranged within the transfer chamber is illustrated. Also, description of some of the units referenced in FIG. 1 will be dispensed with.

As shown in this drawing, the processing units 103 and 103' equipped with the vacuum vessels 113 and 113' are connected to the side faces of the vacuum transfer chamber 111 behind the processing block 102 of the vacuum processing apparatus 100 embodying the invention. When they are connected, side walls of the vacuum vessels 113 and 113' and the connecting flanges 301 and 301' arranged on side walls of the vacuum transfer chamber 111 are respectively connected, and the passages within them are thereby made continuous to form connecting tunnels 302 and 302'. This drawing shows discharging vessels 304 and 304' which are arranged in the upper parts of the vacuum vessels 113 and 113' and have within them the processing chambers into which processing gas is supplied to form plasmas.

In a state in which the transfer chamber 111 is linked to the vacuum vessels 113 and 113', the connecting tunnels 302 and 302' which establish communication between their respective transfer chambers and processing chambers are arranged. These connecting tunnels 302 and 302' are passages through which the sample is exchanged between the processing chambers and the transfer chambers, and there are gates leading to the insides of these chambers. Inside these connecting tunnels 302 and 302', inner covers are arranged as will be further described afterwards, and they are detachably coupled to the connecting tunnels 302 and 302' in close contact with their internal wall faces.

Openings in the end parts of the connecting tunnels 302 and 302' on the transfer chamber side are opened and closed by gate valves 303 and 303' coupled to the vacuum transfer chamber 111. The valve bodies of these gate valves 303 and 303' move in the vertical and horizontal directions between the inside of the transfer chamber and the connecting tunnels 302 and 302' or the processing chambers to block the openings of the gates by covering them. Ring-shaped sealing members to seal the connecting tunnels 302 and 302' by coming into contact with the side wall faces of the transfer chamber around the openings on the connecting tunnels 302 and 302' on the transfer chamber side are arranged on the circumferential side parts of the contact faces of the respective valve bodies with the side wall faces of the transfer chamber. When the gate valve 303 opens the connecting tunnel 302, it uncovers the opening of the gate in the reverse horizontal and vertical directions reverse to the respective directions at the time of blocking.

Figure 4A:
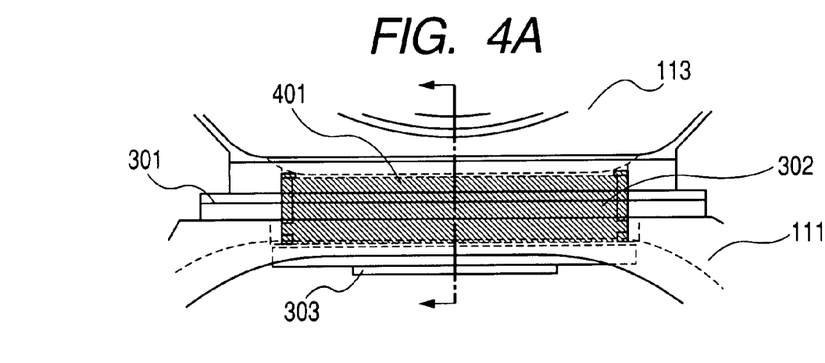
FIGS. 4A, 4B, and 4C show in enlarged views three aspects of the configuration of the vicinities of a connecting tunnel and an inner cover shown in FIG. 3.
Figure 4B:
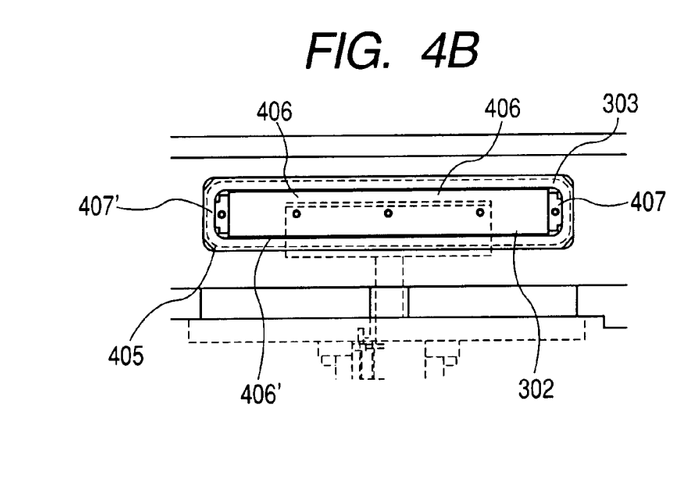
Figure 4C:
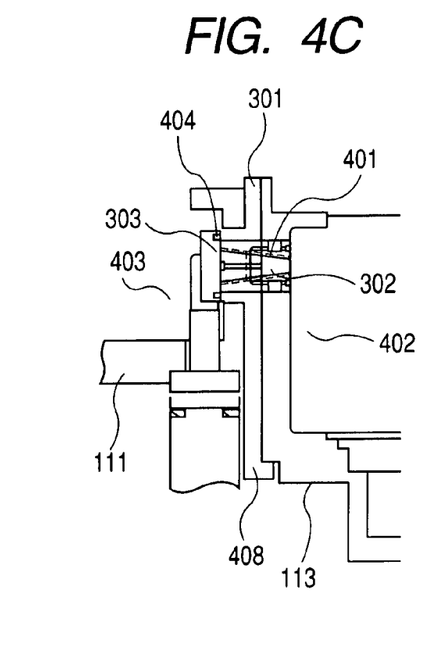

FIGS. 4A, 4B, and 4C show enlarged views of the configuration of the vicinities of a connecting tunnel and an inner cover shown in FIG. 3. FIG. 4A shows a top view of the vicinities of the connecting tunnel; FIG. 4B, a front view of the vicinities of the connecting tunnel seen from inside the transfer chamber; and FIG. 4C, a longitudinal section along line A-A in FIG. 4A.

Referring to these drawings, the configuration of the vicinities of the connecting tunnel 302 including an inner cover 401 will be described. The inner cover 401 shadowed in FIG. 4A is coupled its outer surface inside the connecting tunnel 302 tightly to its internal wall face with substantially no gap left between them in a state in which the transfer chamber 111 is linked to the vacuum vessel 113, and is configured to be removable from this connecting tunnel 302. When it is coupled in this way, the inner cover 401 is first inserted into the connecting tunnel 302 and so positioned as to leave substantially no gap between it and any part of the internal wall face of the tunnel, followed by adjustment to precisely attach each individual part of the external surface of the inner cover 401 to the wall face of the connecting tunnel to allow no gap to remain between them.

As shown in FIGS. 4B and 4C, in this embodiment of the invention, the connecting tunnel 302 is composed of members of the connecting flange 301 and of the vacuum vessel 113 in a state in which the flange and the vessel are connected, and the two chambers are connected as the former communicates with a transfer chamber 403 in the vacuum transfer chamber 111 and the latter with a processing chamber 402 in the vacuum vessel 113. As shown in these drawings, the connecting flange 301 is inserted within an opening formed in a side wall of the vacuum transfer chamber 111, and its end face flat in the vertical direction toward the transfer chamber 403 constitutes part of the internal wall face of the transfer chamber 403.

This end face comes into contact with an external circumferential part of the valve body of the gate valve 303, and a sealing face 405 is formed as the inside and outside of the connecting tunnel 302 are sealed between them. Further, on the external circumferential side of the face with which the valve body of the gate valve 303 comes into contact, a ring-shaped sealing member 404 is so arranged in the part coming into contact with the end face of the connecting flange 301 on the transfer chamber 403 side as to surround the external circumferential side of the opening of the connecting tunnel 302 to accomplish the aforementioned sealing by a pressing action of moving in the horizontal direction toward the connecting tunnel 302 of the gate valve 303.

The valve body of the gate valve 303 has a larger shape than the opening of the connecting tunnel 302 to be able to cover this opening. The end face of the connecting flange 301 on the transfer chamber 403 side with which the sealing member 404 comes into contact to constitute the sealing face 405 is the external circumferential side of the inner cover 401 because of its configuration. Thus, the sealing member 404 in this embodiment is so composed as not to come into contact with the end face of the inner cover 401 on the transfer chamber 403 side.

In this configuration of this embodiment of the invention, the connecting flange 301 is coupled into the opening in the side wall part of the vacuum transfer chamber 111 to be positioned relative to the vacuum transfer chamber 111. Further in this state, the vacuum vessel 113 is mounted on a flange part 408 having an L-shaped section arranged underneath the connecting flange 301 to be positioned relative to the connecting flange 301 or the vacuum transfer chamber 111.

Figure 5A:
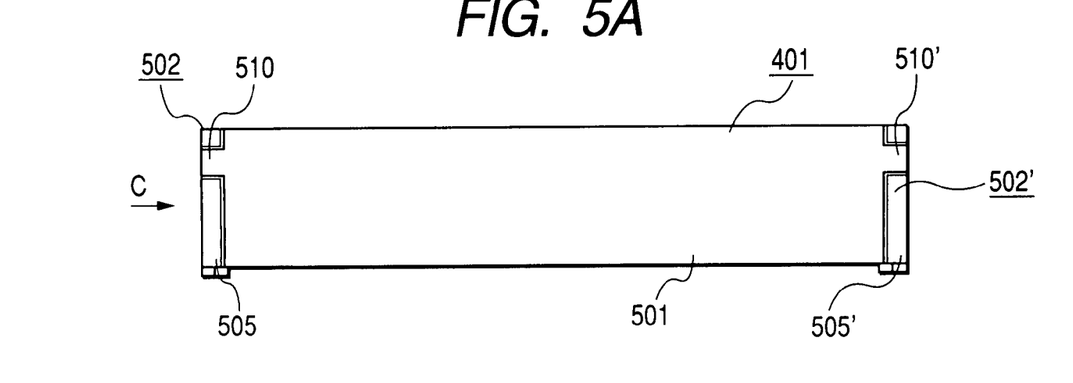
FIGS. 5A, 5B, and 5C show three aspects of the configuration of the inner cover coupled to the connecting tunnel shown in FIGS. 4A, 4B, and 4C.
Figure 5B:
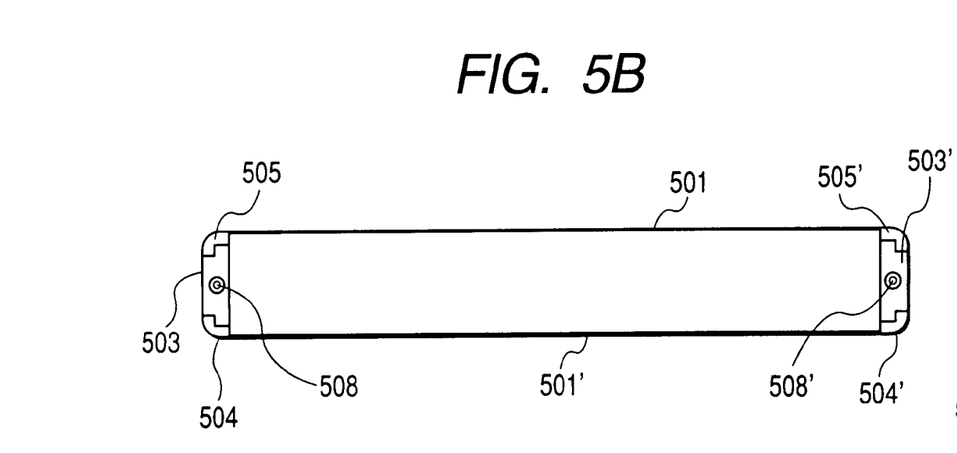
Figure 5C:
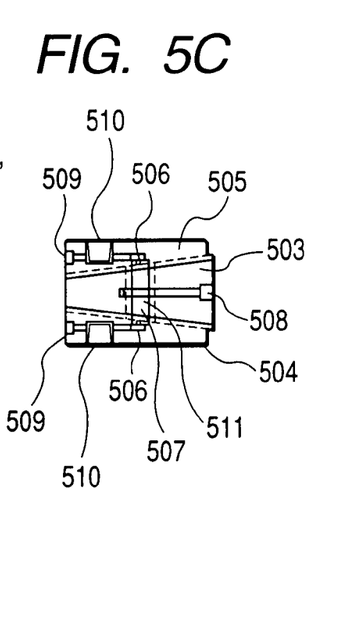

Next, the configuration of the inner cover shown in FIGS. 4A, 4B, and 4C will be described in further detail with reference to FIGS. 5A, 5B, and 5C. FIGS. 5A, 5B, and 5C show three aspects of the configuration of the inner cover coupled to the connecting tunnel shown in FIGS. 4A, 4B, and 4C. FIG. 5A shows a top view of the inner cover in FIG. 4. FIG. 5B shows a front view of the inner cover seen from the transfer chamber side, and FIG. 5C shows a side view of the inner cover seen in the C direction.

In this embodiment, the inner cover 401 covers the internal wall face of the connecting tunnel 302 in tight contact. The parts of the inner cover 401 which are to be coupled to the mutually opposing top and bottom of the internal wall of the connecting tunnel 302 have plate members 501 and 501' which, before they are coupled, are arc-shaped from the right and left ends in FIGS. 5A and 5B to be convex in the vertical direction to facilitate close fitting to internal wall faces (internal wall faces opposite each other in the vertical direction of FIG. 4B) 406 and 406', which are flat in the widthwise direction of the connecting tunnel 302, and these plate members 501 and 501' serve as plate springs.

The inner cover 401 is further provided with members which are the two end faces of the plate member 501 (or 501') covering these internal wall faces 406 and 406' of the connecting tunnel 302 opposite each other in the vertical direction in tight contact with them and which are members covering internal wall faces (internal wall faces opposite each other in the lateral direction of FIG. 4B) 407 and 407' at the two end faces of the connecting tunnel 302 in the widthwise direction in tight contact with them. These members are connected, linked or coupled with the two end faces of the two plate members 501 and 501' arranged up and down as connecting blocks 502 and 502'. The connecting blocks 502 and 502' connecting these two plate members 501 and 501' are provided with wedge-shaped guides 503 and 503', and pieces A 504 and 504' and pieces B 505 and 505' arranged with the guides 503 and 503' between them as shown in FIGS. 5B and 5C.

These guides 503 and 503', pieces A 504 and 504' and pieces B 505 and 505' are so configured that, when the inner cover 401 is coupled to the connecting tunnel 302, they well fit each other in the inclined parts of the wedge-shaped guides 503 and 503' tapered in the axial direction of the connecting tunnel 302, namely the direction in which the transfer chamber 403 and processing chamber 402 are oriented.

This fitting face is configured in the tapered shape shown in FIG. 5C, and the guide 503 is linked to the piece A 504 and the piece B 505 arranged above and beneath it by being engaged with a spring pin 506 as shown in this drawing. By tightening or loosening a guide bolt 508 screwed onto a pin 507 penetrating within the guide 503, the guide is moved relative to the piece A 504 and the piece B 505 above and underneath with respect to the axial direction of the guide bolt 508 (the axial direction of the connecting tunnel).

By loosening the guide bolt 508 for instance, the guide 503 is moved relative toward the transfer chamber 403 and, along with this, the piece A 504 and the piece B 505 above and underneath move respectively upward and downward in the direction of substantially widening the gap between these elements and the connecting tunnel 302. Conversely by tightening the guide bolt 508, the guide 503 is moved relatively in the direction of the processing chamber 402, and the inner cover 401 is made fixable within the connecting tunnel 302 while pressing the piece A 504 and the piece B 505, namely the connecting block 502, in the vertical direction within the connecting tunnel 302.

Because of this inclination constituting the taper, which is the fitting faces of the guide 503 with the piece A 504 and the piece B 505, the relative movements of these elements vary the overall height of the connecting block 502. This feature is utilized to enable the overall height of the connecting block 502 to be reduced by loosening the guide bolt 508, to widen the gap between the connecting tunnel and the inner cover to facilitate removal of the latter while enabling the height of the connecting block 502 by tightening the guide bolt 508 and the block to be fixed by pressing it against the internal wall face of the connecting tunnel 302.

The inner cover 401 so acts that, when the arc shapes of the plate members 501 and 501' are pressed inward to be made concave and, after they are inserted into the connecting tunnel 302 and relieved of the pressure, the urging forces of the plate springs press the plate members 501 and 501' against the internal wall face of the connecting tunnel 302 and bring them into tight contact with the wall face to eliminate the gap between them. This restrains adverse effects suffered by processing and maintenance from the influx into the gap of products and the like resulting from the processing of the sample with the plasma in the processing chamber 402.

Also, the pressing of the connecting blocks 502 and 502' against the internal wall face of the connecting tunnel 302 causes both ends each of the plate members 501 and 501', which are near their respective links to the connecting blocks 502 and 502', to be displaced upward and downward, respectively, and thereby to be brought into tight contact with the connecting tunnel 302. While these connecting blocks 502 and 502' are arranged at the two ends of the inner cover 401, the corners of the connecting tunnel 302 are brought into tight contact with the internal wall face to restrain adverse effects suffered by processing and maintenance from the influx into the gap of products and the like. To further increase the tightness of this contact, the corners of the connecting tunnel are composed of curved faces whose sections constitute curves of a prescribed radius, and the pieces A 504 and 504' and the pieces B 505 and 505' respectively of the connecting blocks 502 and 502', which come into contact with these corners are also composed of curved faces whose sections constitute curves.

The connecting block 502 and 502' and the plate members 501 and 501' of the inner cover 401 are so coupled that detachable piece bolts 509 and 509' arranged in the respective axial directions of the pieces A 504 and 504' and the pieces B 505 and 505' and flange parts 510 and 510' extending in a crank shape from the ends of the plate members 501 and 501' are engaged with each other to be linked. Incidentally, the plate members 501 and 501' and the connecting blocks 502 and 502' are linked to each other with prescribed backlashes so that tight contact can be achieved against dimensional fluctuations in the widthwise direction of the connecting tunnel 302. Thus, the piece bolts 590 and 509' and the flange parts 510 and 510' of the plate members 501 and 501' are loosely linked to each other with gaps between them in a connected state, and a wider adjustable range is allowed than the dimensional tolerance of the connecting tunnel 302 in the widthwise direction.

The pin 507 is arranged penetrating the guide 503, and a long hole 511 in which this pin 507 can slide is bored. The pieces A 504 and B 505 are coupled to the two ends of the pin 507. Further, the long hole 511 is arranged in penetration so that these pieces can move up or down together in response to variations in the height of the connecting block 502, and plural components including the pieces A 504 and B 505 and the guide 503 are so assembled as to be integrated by the spring pin 506 into the connecting block 502.

Non-penetration of the hole for the spring pin 506 bored in the piece A 504 and the piece B 505 can prevent the inner cover 401, the connecting block 502 or the component composed by assembling them from coming into contact with reactive gas reaching the internal wall face of the connecting tunnel and thereby contribute to extending their lives until replacement. The configuration described above is also true of the connecting block 502'.

Also, the inner cover 401 allows removal and replacement of only the plate members 501 and 501' by removing the piece bolts 590 and 509' linking the plate members 501 and 501', the pieces A 504 and 504' and the pieces B 505 and 505' after moving it from the connecting tunnel 302 toward the transfer chamber 403 or the processing chamber 402 and removing it. Further, by removing the bolts for linking after removing the inner cover 401 from the connecting tunnel 302, removal of reaction products stuck to not only the plate member 501 and the connecting blocks 502 and 502' at the two ends but also the pieces A 504 and 504', the pieces B 505 and 505', the guides 503 and 503' and the spring pins 506 and 506', which are constituent parts of the connecting blocks 502 and 502', is facilitated.

Although the direction in which the inner cover 401 is removed is toward inside the transfer chamber 403 in this embodiment, even if it is to be moved toward the processing chamber 402 when it is to be removed, maintenance of or parts replacement in the vacuum vessels 113 and 113' or the processing units 103 and 103', which are the objects to be worked on, can be accomplished without opening the transfer chamber 403 to the atmosphere, by operating the gate valve 303 to seal the connecting tunnel 302 and the transfer chamber 403 at the time of removal or fitting. This feature enables parts replacement or maintenance to be performed in the processing unit to be so worked on while a sample is being processed in another processing unit, and thereby makes it possible to shorten the time until the resumption of processing after the replacement or maintenance is completed. In this way, the operating efficiency of the processing apparatus, and accordingly the efficiency of processing, can be enhanced.

The embodiment of the invention described so far can help restrain adverse effects of products or gases generated in the processing chamber on the inside of the connecting tunnel, shorten the length of time taken for maintenance or cleaning and thereby enhance the working efficiency. Furthermore, it contributes to reducing the non-processing period, such as the length of time taken for maintenance, inspection or parts replacement and that taken until the resumption of processing, thereby enhancing the operating efficiency of the processing apparatus and accordingly the efficiency of processing.

What is claimed is:

1. A vacuum processing apparatus comprising:
a vacuum vessel having a processing chamber;
a transfer chamber connected to the vacuum vessel, via a connection tunnel, to transfer a sample to the processing chamber inside the vacuum vessel; and
a cover member removably disposed inside the connection tunnel to cover an internal wall of the connection tunnel, the cover member comprising a pair of plate spring members coupled to mutually opposing top and bottom of the internal wall of the connection tunnel to contact thereto, and a pair of connecting blocks which are disposed at and linked with both ends of the pair of plate spring members at upper and lower portions thereof, the connecting blocks pressing the upper and lower portions toward the top and bottom of the internal wall of the connection tunnel to tightly contact top and bottom surfaces thereof with the internal wall face of the connection tunnel at both end portions in a widthwise direction thereof;
wherein each connecting block is provided with an adjustment mechanism provided to adjust the height of the connecting block between the top and bottom surfaces of the connecting block relative to the top and bottom of the internal wall of the connection tunnel, the top and bottom surfaces and outer surfaces of the plate spring members disposed between the top surfaces or between the bottom surfaces being pressed to tightly contact with the internal wall face of the connection tunnel.

2. The vacuum processing apparatus according to claim 1, wherein the plate spring members are removable from the cover member.

3. The vacuum processing apparatus according to claim 1, wherein the connecting blocks are provided with wedge-shaped guides tapered in an axial direction of the connection tunnel, and a pair of pieces surrounding the wedge-shaped guides with relative movements to vary the height of the connecting blocks in a top or down direction within the connection tunnel.

4. The vacuum processing apparatus according to claim 1, wherein each of the plate spring members is linked respectively to the upper portion and the lower portion of each connecting block of the cover member with flange portions of each of the plate spring members extending in a crank shape at the both ends thereof coupled around an axial direction of the connection tunnel with backlashes so that tight contact is achieved against dimensional fluctuations in a widthwise direction of the connection tunnel.

5. A vacuum processing apparatus comprising:
a vacuum vessel having a processing chamber;
a transfer chamber which is connected to the vacuum vessel to transfer a sample to the processing chamber inside the vacuum vessel;
a passage which establishes communication between the transfer chamber and the vacuum vessel when the transfer chamber and the processing chamber are connected to each other; and
a cover member which is removably disposed inside the passage to cover an internal wall face of the passage,
wherein the cover member comprises:
a pair of plate spring members which, in a disposed state, are forced toward mutually opposite internal wall faces of the passage, to cover the internal wall face of the passage, and
pair of connecting blocks which are linked with both ends of said pair of plate spring members at upper and lower portions thereof, top and bottom surfaces thereof tightly contacting with the internal wall face of the passage at both end portions in a widthwise direction thereof,
wherein each connecting block includes an adjustment mechanism which varies the height between the top and bottom surfaces of the connecting block and which presses the top and bottom surfaces and outer surfaces of the plate spring members disposed between the top surfaces or between the bottom surfaces to tightly contact with the internal wall face of the passage, and
wherein the sample is processed within the processing chamber with a plasma generated in the processing chamber.

6. The vacuum processing apparatus according to claim 5, wherein the plate spring members or the outer surface of the connecting block of the cover member are pressed against the internal wall face of the passage, when the height between the top and bottom surfaces of the connecting block is enlarged.

7. The vacuum processing apparatus according to claim 5 or 6, wherein, when the height between the top and bottom surfaces of the connecting block is made small, the plate spring members are transformed into an arc-shaped form to be convex in a top or down direction to facilitate close fitting to the internal wall face of the passage.

8. The vacuum processing apparatus according to claim 7, wherein the plate spring members are removable from the cover member.

9. The vacuum processing apparatus according to claim 8, wherein:
the plate spring members are linked respectively to the upper portion and the lower portion of each connecting block of the cover member with flange portions of each of the plate spring members extending in a crank shape at the both ends thereof,
the connecting block has a wedge-shaped guide whose width in the top or down direction becomes smaller toward the transfer chamber or the processing chamber, and a pair of pieces arranged above and below the guide, and
said pair of pieces are separated from each other in the top or down direction along with the movement of the guide toward the transfer chamber or the processing chamber.

10. The vacuum processing apparatus according to claim 7, wherein:
the plate spring members are linked respectively to the upper portion and the lower portion of each connecting block of the cover member with flange portions of each of the plate spring members extending in a crank shape at the both ends thereof,
the connecting block has, a wedge-shaped guide whose width in the top or down direction becomes smaller toward the transfer chamber or the processing chamber, and a pair of pieces arranged above and below the wedge-shaped guide, and
said pair of pieces are separated from each other in the top or down direction along with the movement of the guide toward the transfer chamber or the processing chamber.

11. The vacuum processing apparatus according to claim 7, wherein:
the plate spring members are linked respectively to the upper portion and the lower portion of each connecting block of the cover member with flange portions of each of the plate spring members extending in a crank shape at the both ends thereof coupled around an axial direction of the passage with backlashes
and can be displaced with respect to the plate spring members in a widthwise direction on a right or left side of the passage.

12. The vacuum processing apparatus according to claim 7, wherein:
the plate spring members respectively are linked to the upper portion and the lower portion of each connecting block of the cover member with flange portions of each of the plate spring members extending in a crank shape at the both ends thereof, and
the connecting block can be disassembled into a plurality of parts including the plate spring members.

* * * * *